United States Patent [19]

Chester et al.

[11] 4,441,199
[45] Apr. 3, 1984

[54] METHOD AND APPARATUS FOR AMPLITUDE LIMITING A COMPOSITE SIGNAL

[76] Inventors: John K. Chester, 99 Myrtle Ave., Brooklyn, N.Y. 11201; Eric Small, 331 Clinton St., Brooklyn, N.Y. 11231; Eric D. Stoll, 117 Hillside Ave., Teaneck, N.J. 07666

[21] Appl. No.: 391,845

[22] Filed: Jun. 24, 1982

[51] Int. Cl.³ .............................................. H04H 5/00
[52] U.S. Cl. ..................................... 381/14; 307/551; 328/171; 332/18; 381/107
[58] Field of Search ............... 307/511, 522, 529, 351, 307/360, 551, 555, 556, 561; 328/169, 171; 332/16 R, 16 T, 17, 18, 21, 23 R; 381/2–4, 6–10, 14, 104, 106, 107; 455/43, 45

[56] References Cited

U.S. PATENT DOCUMENTS

| | | | |
|---|---|---|---|
| 3,240,878 | 3/1966 | Dome | 381/14 |
| 3,290,433 | 12/1966 | DeFrance et al. | 358/14 |
| 3,477,042 | 11/1969 | Wachs | 332/16 |
| 3,517,314 | 6/1970 | Miyagi | 455/43 |
| 3,566,281 | 2/1971 | Baumann | 328/169 X |
| 3,579,274 | 5/1971 | Jensen et al. | 307/228 |
| 3,949,173 | 4/1976 | Duval et al. | 370/74 |
| 4,112,259 | 9/1978 | Mendenhall | 381/7 |
| 4,134,074 | 1/1979 | Hershberger | 328/169 |
| 4,166,924 | 9/1979 | Berkley et al. | 381/66 |
| 4,207,527 | 6/1980 | Abt | 381/104 X |
| 4,246,440 | 1/1981 | Van Der Heide et al. | 381/14 |

OTHER PUBLICATIONS

2 Sheets Entitled "STA-MAX Wideband Modulation Controller", (Automated Broadcast Controls).
2-Page Product Sheet Entitled "The WBL Composite Limiter", (ELCOM Specialty Products, Inc.).

Primary Examiner—A. D. Pellinen
Attorney, Agent, or Firm—Kenyon & Kenyon

[57] ABSTRACT

Two parallel signal paths carry a composite signal having a narrow-band component such as an FM station's composite signal. The first path includes a notch filter that removes the narrow-band component, such as the FM stereo pilot tone, from the composite signal and also includes a reciprocal clipper coupled to the output of the notch filter that selects peaks beyond given maximum and minimum limits from the remainder of the composite signal. These peaks are then effectively subtracted from the corresponding peaks of the composite signal in the second path and the resultant signal is used to modulate the station's carrier frequency. The resultant signal is an amplitude limited composite signal in which the narrow-band component is substantially unimpaired even though the composite signal has been amplitude limited.

13 Claims, 8 Drawing Figures

METHOD AND APPARATUS FOR AMPLITUDE LIMITING A COMPOSITE SIGNAL

BACKGROUND OF THE INVENTION

The present invention relates to information and communications systems and particularly to those systems wherein it is desirable that a given narrow-band component of a composite signal be preserved substantially intact when other information in the composite signal is amplitude limited. The embodiment described herein is adapted, for example, for use in FM stereo broadcasting.

In FM stereo radio broadcast practice as prescribed by the Federal Communications Commission (FCC), information derived by subtracting left and right audio channels (L−R) amplitude modulates a 38 kHz stereo subcarrier. This subcarrier is then substantially removed leaving two sideband signals. The two sideband signals and the sum of the left and right audio channels (L+R) are added to a 19 kHz stereo pilot tone synchronizing signal. The resultant composite signal is used to frequency modulate a radio station's government designated carrier frequency.

To prevent interference between the designated broadcast frequencies, permissible carrier frequency modulation is currently restricted by the FCC to a peak deviation of not more than 75 kHz. The amplitude of the composite signal modulating the carrier must be limited to avoid exceeding this modulation constraint. Further, in commercial FM broadcasting, maximum apparent strength for the audio signal is commonly considered desirable, which increases the incidence of signal peaks likely to produce excessive modulation and carrier deviation.

Apparatus for limiting the amplitude of an audio input is well known in the broadcasting and recording arts. Common amplitude limiting techniques, however, produce large amounts of high frequency information, i.e., distortion products, which themselves are subject to distortion in subsequent processing. Thus, in the case of FM stereo broadcasting, it is desirable to limit amplitude after the composite signal has been generated.

The STA-MAX wide-band modulation controller manufactured by Automated Broadcast Controls is a limiter that acts on the composite signal. In varying the gain applied to the composite signal to restrict its amplitude, however, this limiter causes amplitude modulation of the stereo pilot tone. This modulation of the station's pilot causes degradation of stereo reception for radio receivers in which the modulated pilot tone only intermittently exceeds the receivers' detection threshold for that pilot tone. The minimum amplitude of the station's amplitude-modulated stereo pilot may also be inadequate to meet the minimum signal quality standards required by the government for stereo broadcasts.

SUMMARY OF THE INVENTION

It is an object of the present invention to provide an apparatus which limits the amplitude of a composite signal having a narrow-band component without affecting the narrow-band component. In accordance with the present invention, an apparatus and method is provided in which the composite signal containing a narrow-band component is applied to means for producing a remainder signal, such as a notch filter, in which the narrow-band component is substantially removed. The remainder signal is then applied to means for providing a peak signal, the peak signal comprising peaks in the remainder signal beyond given maximum and minimum amplitudes. The peak signal and the composite signal are then combined so that the peaks in the composite signal and the corresponding peaks of the peak signal substantially cancel each other, resulting in an amplitude limited composite signal in which the narrow-band component is substantially unimpaired because it was removed prior to limiting. In order to insure proper combination of the composite signal and the peak signal so as to eliminate all amplitude information beyond the given amplitude range, phase compensation means for providing the two signals in the proper phase relationship before combination of the two signals is included.

Amplitude limiting of the composite signal is thus effected without affecting the narrow-band component. This is particularly advantageous where the composite signal contains variable amplitude information and a constant-amplitude pilot, bias or carrier component. Amplitude limiting in accordance with the present invention, after the composite signal has been generated, improves the fidelity of the composite signal and preserves the narrow-band component while maximizing the information signal within given constraints through peak limiting.

BRIEF DESCRIPTION OF THE DRAWINGS

In the detailed description of the preferred embodiment given below, reference is made to the attached drawings in which.

DETAILED DESCRIPTION

Figure 1:
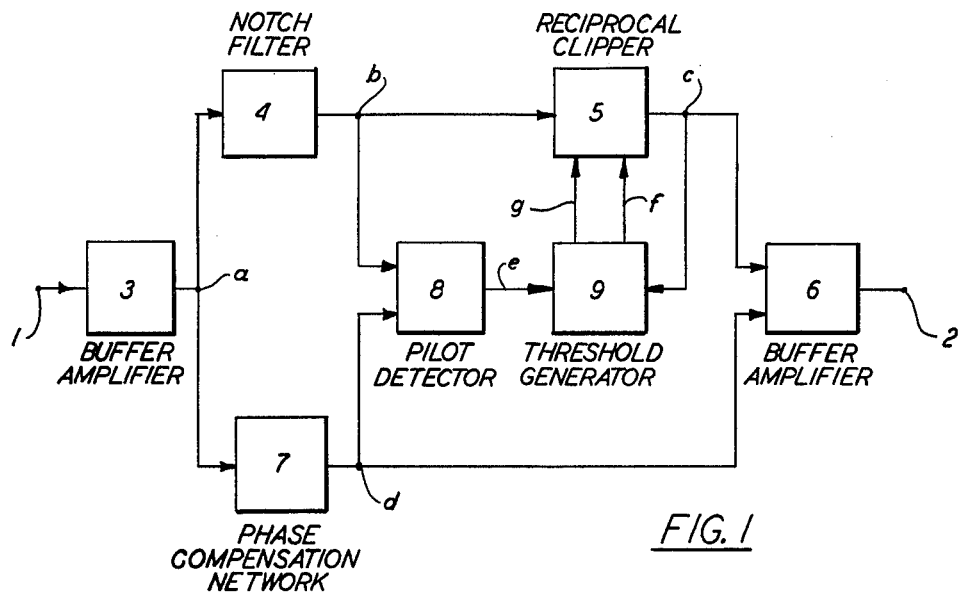
FIG. 1 is a block diagram of the presently preferred embodiment.

With reference to the drawings, a composite signal, consisting of broadband information and a narrow-band synchronizing signal, for example, the stereo pilot tone, enters at terminal 1 as shown in the block diagram of FIG. 1. Input buffer amplifier 3 amplifies the composite signal by an adjustable gain. The composite signal at point a then passes through two separate paths whose outputs c and d are combined by linear addition in the output buffer amplifier 6.

The first path comprises a phase compensated band-reject or notch filter 4 and reciprocal clipper 5. The notch filter 4 substantially removes the narrow-band 19 kHz pilot tone. The remaining broadband information enters the reciprocal clipper 5. The input-output relationship for the reciprocal clipper 5 is represented by the idealized transfer function shown in FIG. 5. When the input signal at b is between a lower threshold voltage VT− and an upper threshold voltage VT+, the output at c is zero. When the input signal exceeds threshold voltage VT+, the output at c is equal to the difference between the input signal and the threshold voltage VT+. Similarly, when the input signal is less than the lower threshold voltage, VT−, the output at c is equal to the difference between the input signal and the threshold voltage VT−. Thus, the output of the reciprocal clipper at c, is the "excess" of the signal at b, or the peaks beyond the given threshold voltages VT+ and VT−.

The second path comprises a phase compensation network 7 with input at a and output at d. The transfer function of this network is the linear equivalent of the first path in gain and phase at all frequencies containing broadband information, and thus compensates for the phase distortion produced in the first signal path. In the embodiment illustrated, the phase compensation network insures that the signal at d has the opposite phase of the peak signal at c, so that when the signals at c and d are combined in output buffer amplitude 6, they are properly subtracted.

The frequency information comprising the signal at output terminal 2 of the buffer amplifier is a substantially accurate representation of the input signal at terminal 1, with the exception that the amplitude of the broadband information is limited to a predetermined value. The narrow-band synchronizing signal passes through with no amplitude limiting.

Figure 4:
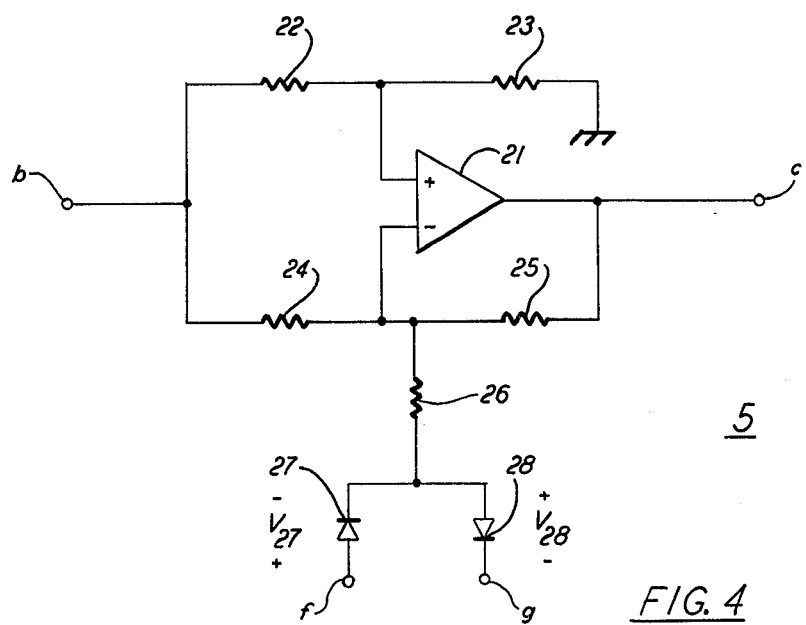
FIG. 4 is a circuit diagram of an embodiment of the reciprocal clipper 5 of FIG. 1.

FIG. 4 is a schematic diagram of reciprocal clipper according to the invention. The clipper 5 comprises an operational amplifier 21, a resistor network comprised of resistors 22, 23, 24, 25 and 26, and two rectifier diodes 27 and 28. Amplifier 21 may take the form of any of a number of devices well-known in the art that provide a low common mode gain and a relatively high differential mode gain.

The resistances in resistors pairs 22 and 23 and 24 and 25, respectively, are selected such that they are in the same ratio, i.e., 22:23::24:25. In the presently preferred embodiment, the resistances 22, 23, 24, and 25 are all equal to a nominal value and resistance 26 is equal to one-half the nominal value. The nominal value used is a matter of convenience to one skilled in the art. Thus, the resistor pairs 22 and 23 and 24 and 25 form voltage divider circuits wherein the inputs to amplifier 21 are at one half the level at point b. Rectifier diodes 27 and 28 are connected to threshold reference voltages of equal magnitude but of opposite polarity through terminals f and g respectively. The positive threshold reference voltage level is equal to one-half the threshold voltage VT+ less the voltage drop of the diode 28 ($\frac{1}{2}$VT+ − $V_{28}$). Similarly, the negative threshold reference voltage level is equal to one-half the threshold voltage level VT− plus the voltage drop of the diode 27 ($\frac{1}{2}$VT− + $V_{27}$).

Analysis of the reciprocal clipper circuit shows that, for the input voltage at b greater than VT− but less than VT+, no current flows through resistor 26, and a common mode signal is provided to amplifier 21. Hence no signal is produced at c, and the output voltage at c is substantially zero. When the magnitude of the input voltage exceeds a threshold level, current flows through resistance 26 and through diode 27 or 28 depending on the polarity of the input voltage, and a differential mode input is provided to amplifier 21. The output voltage at c is then the excess of the input voltage compared to the nearest threshold voltage. Thus, the circuit of FIG. 4 has the transfer characteristic shown in FIG. 5.

Figure 2:
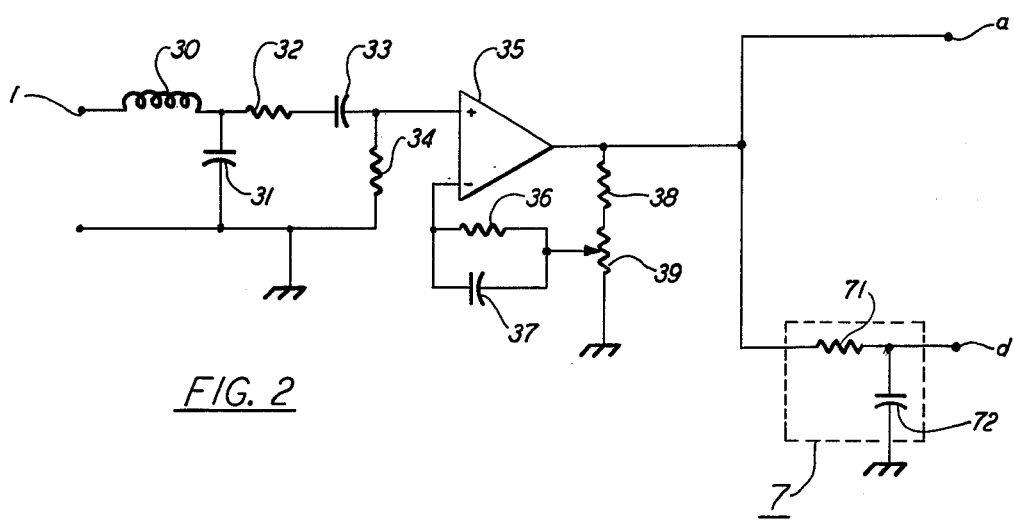
FIG. 2 is a circuit diagram of an embodiment of the input buffer amplifier 3 and the phase compensation network 7 of FIG. 1.

FIG. 2 is a circuit diagram of the input buffer amplifier 3 and phase compensation network 7. Amplifier 35 amplifies the input signal at terminal 1 by an adjustable gain determined by resistor 38 and potentiometer 39. Inductor 30, capacitors 31 and 33, and resistor 32 form a filter network to remove unwanted and extraneous signals from the desired signal. These extraneous signals typically comprise radio frequency and direct current components. Resistors 34 and 36 and capacitor 37 form a filter network to ensure equalized voltage drops due to bias currents at both inputs to amplifier 35 and uniform gain over the frequency range of the broadband input signal.

Phase compensation network 7 is comprised of resistor 71 and capacitor 72 and serves to compensate for the excess delay, predominantly at the upper frequency range of the broadband input signal, as the signal passes through filter 4 and reciprocal clipper 5 in the first signal path.

Figure 3:
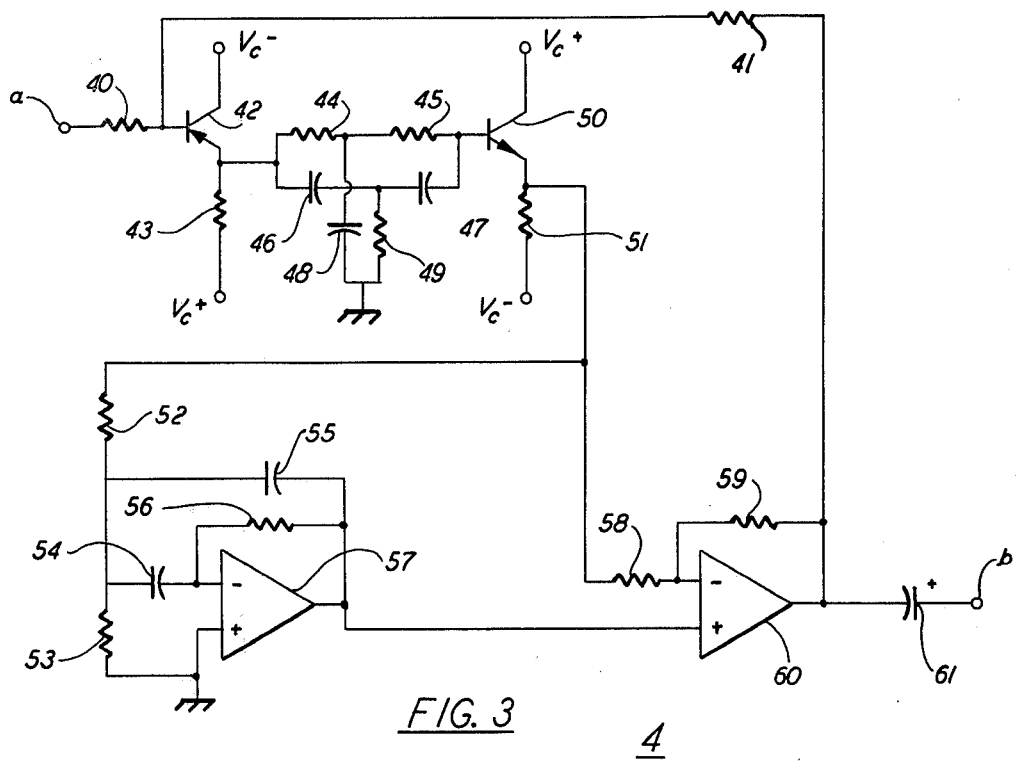
FIG. 3 is a circuit diagram of an embodiment of the band reject filter 4 of FIG. 1.

FIG. 3 is a circuit diagram of the band-reject or notch filter 4. The resistor-capacitor network formed by resistors 44, 45, and 49, and capacitors 46, 47, and 48 is a twin-tee configuration wherein the component values are chosen to produce a high attenuation between the emitter of isolation transistor 42 and the base of isolation transistor 50 at the center frequency of the narrow-band synchronizing signal. Resistors 43 and 51 are biasing resistors for the transistors, which are connected to sources of opposite potential $V_c+$ and $V_c-$ as shown.

The output signal from the twin-tee filter network which appears at the emitter of transistor 50 is applied to summing amplifier 60 through input resistor 58 and to a compensation filter network comprised of amplifier 57, resistors 52, 53, and 56, and capacitors 54 and 55. This compensation network serves to partially compensate amplitude and phase variations within the broadband information frequency range nearest the notch caused by the twin-tee filter.

Summing amplifier 60, in conjunction with resistors 40, 41, and 59 provides overall negative feedback for the notch filter which serves to further reduce amplitude and phase variations within the broadband information frequency range. Capacitor 61 couples the output of the notch filter 3 to internal terminal b and provides blocking of direct current signals.

Figure 6:
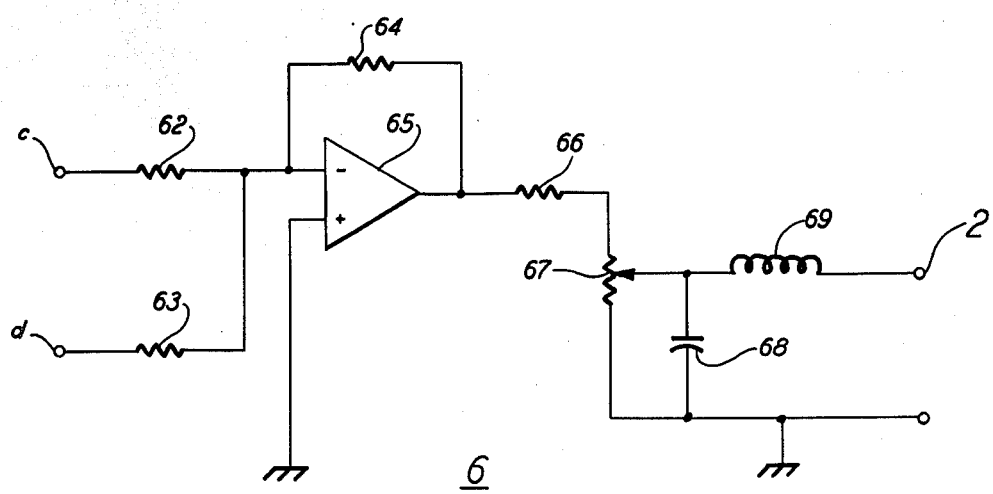
FIG. 6 is a circuit diagram of an embodiment of the output buffer amplifier 6 of FIG. 1.

FIG. 6 is a circuit diagram of output buffer amplifier 6. This circuit combines signals from reciprocal clipper 5 and phase compensation network 7 via internal terminals c and d respectively. The circuit of FIG. 6 is comprised of amplifier 65 and resistances 62, 63, 64 and 66 and potentiometer 67. Potentiometer 67 provides adjustable signal levels to an output filter network comprising capacitor 68 and inductor 69. This filter network connects to output terminal 2 and provides isolation from unwanted and extraneous signals, typically radio frequency energy from external sources. As shown, the peak signal at c and composite signal at d are added by amplifier 65. The signals at c and d are substantially 180°, out of phase so that the signals are subtracted. It is obvious to one skilled in the art that other methods for accomplishing subtraction of the signals could be used. For example, each signal could be provided substantially in phase at points c and d by placing a unity gain inverting amplifier in either of the two signal paths and respectively coupling the signals to the inverting and non-inverting inputs of amplifier 65.

Figure 7:
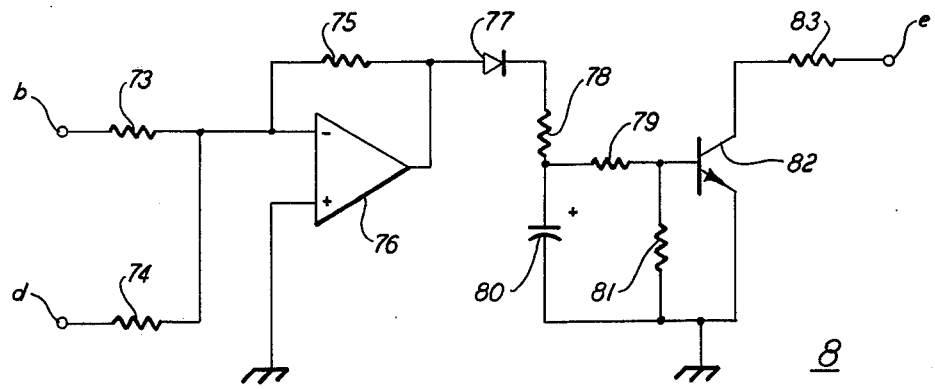
FIG. 7 is a circuit diagram of an embodiment of the pilot signal detector 8.

FIG. 7 is a circuit diagram of the narrow-band synchronizing or pilot signal detector 8. The signals impressed at internal terminals b and d are essentially identical and of opposite polarity except that the signal at b does not contain the narrow-band synchronizing pilot signal, which has been substantially removed by notch filter 4. Amplifier 76, in conjunction with resistors 73, 74 and 75, serves to linearly add the signals of opposite polarity at b and d and produces a representation of the pilot signal at the output terminal of amplifier 76. Diode 77, resistors 78, 79 and 81 and capacitor 80 comprise a peak detector and filter circuit which produces a positive polarity bias signal sufficient to drive transistor 82 into conduction whenever the pilot signal is present in the composite input signal at 1. When the pilot is absent, transistor 82 is non-conductive. Resistor 83 couples the collector of transistor 82 to output terminal e.

Figure 8:
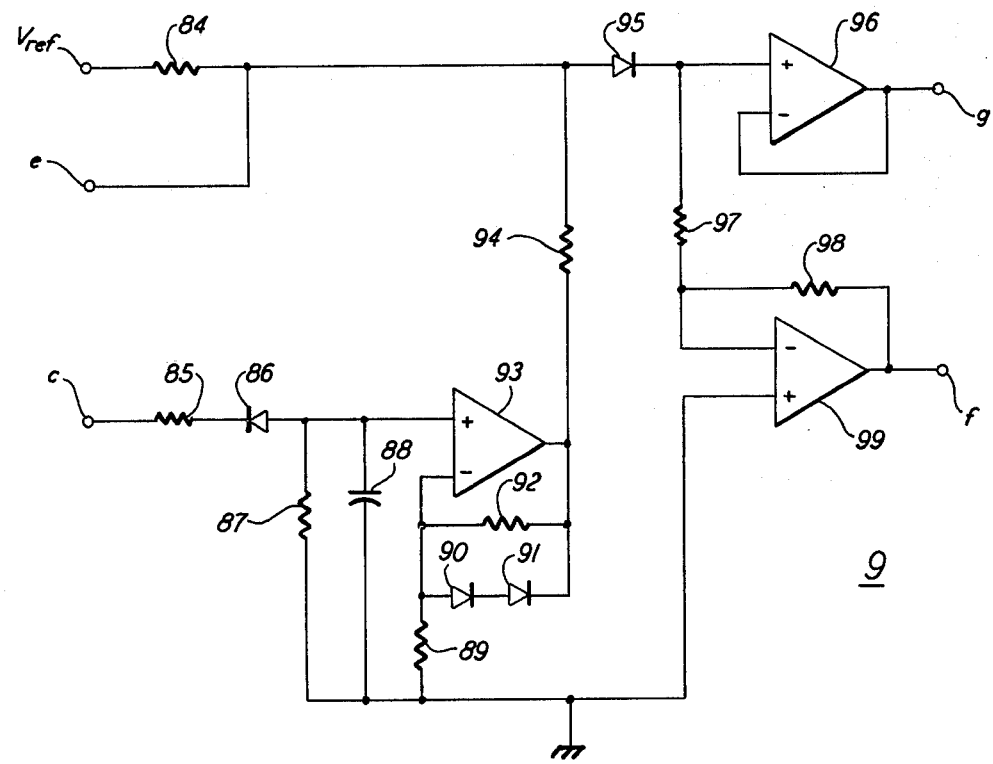
FIG. 8 is a circuit diagram of an embodiment of the thresholds generator 9 of FIG. 1.

FIG. 8 is a circuit diagram of the thresholds generator 9, which is coupled to reciprocal clipper 5. Generator 9 receives inputs form an internally generated D.C. reference voltage, Vref, pilot signal detector 8 at e and the filtered and reciprocally clipped composite signal at c. The positive polarity D.C. reference voltage, Vref, is connected through resistor 84 and diode 95 to the threshold amplifiers 96 and 99. Amplifier 96 is connected in a unity-gain noninverting configuration and supplies the positive threshold reference voltage to terminal g. Amplifier 99, in conjunction with resistors 97 and 98 form a unity-gain inverting amplifier and supplies the negative threshold reference voltage to terminal f.

When transistor 82 of the pilot detector circuit of FIG. 7 becomes conductive, corresponding to the presence of a pilot signal, a shunt current flows through terminal e, resistor 83 and transistor 82. This current increases the voltage drop across resistor 84 which causes the magnitude of the opposite polarity threshold reference voltages to decrease. The decrease in the threshold reference voltages reduces the effective clipping levels of the reciprocal clipper 5, thus causing increased clipping action and preventing excessive composite signal energy from appearing at output terminal 2.

Figure 5:
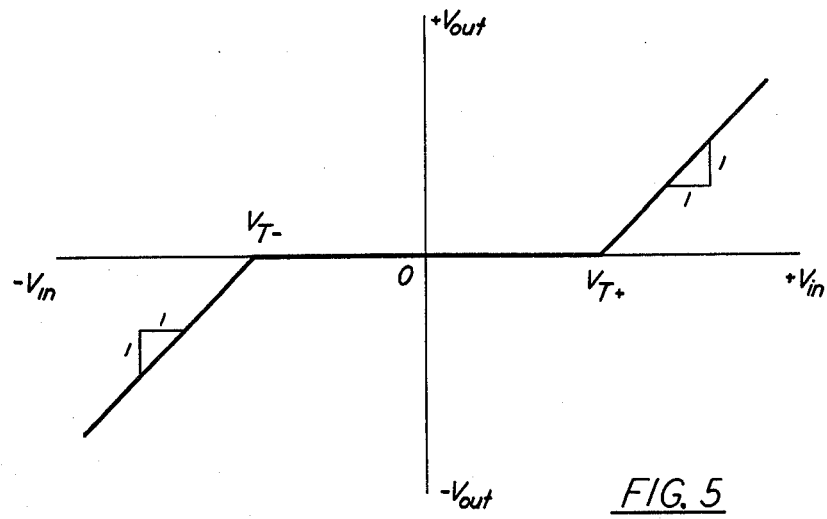
FIG. 5 is a graph of the idealized signal transfer characteristic of the reciprocal clipper 5.

When reciprocal clipping action occurs in reciprocal clipper 5, a peak signal is produced at terminal c. Resistors 85 and 87, diode 86 and capacitor 88 form a peak detecting and filtering circuit which responds to the peak signal. Amplifier network comprising amplifier 93, resistors 89 and 92 and diodes 90 and 91 amplifies the filtered peak signal. The amplified signal is of negative polarity and is connected to terminal e through resistor 94. Resistor 94 serves as an additional shunt current path for current supplied from reference source, Vref, through resistor 84. The action of the additional shunt current is similar to that of the shunt current through terminal e caused by pilot detector 8, described above, that is, the magnitude of the clipping threshold reference voltages at terminals f and g is decreased. The amplifier network comprising components 89, 90, 91, 92 and 93 serves to provide a non-linear threshold reference voltage magnitude change. This non-linear characteristic compensates for the non-ideal voltage current relationship of diodes 27 and 28 of FIG. 4 and helps to produce a more nearly ideal reciprocal clipper transfer characteristic as shown in FIG. 5. This configuration reacts to a lesser degree when the broadband information signal is principally a single tone as compared to multiple frequency components such as speech and music. This is because single tone signals generally have a lower peak to root-mean-square ratio than speech or music signals.

Thresholds generator 9 in the preferred embodiment automatically adjusts the clipping threshold voltages for conditions which occur frequently in the generation of FM stereo broadcasting signals. For example, if a monaural signal is being broadcast, the pilot signal is absent. Thus, 100% FM modulation of the carrier signal by the audio information is possible, and the clipping level may be increased, corresponding to less clipping action. When a stereo signal is being broadcast, the pilot signal is present. Thus, less than 100% modulation is required because the pilot signal itself constitutes a fraction of the total modulation of the carrier signal. Thus, the composite signal must be clipped more, corresponding to decreased clipping levels.

Similarly, test signals such as sine wave signals are often used to test the modulation of the FM transmitter. Because sine waves and other simple signals have less peak information content, less clipping action is required. Thus, clipping levels may be increased for such signals. The circuit of FIG. 8 automatically adjusts the threshold voltages, and thus the clipping levels for these varying signals and thus provides a dynamic clipping level shift based on program material.

The invention has been described herein with particular reference to a presently preferred embodiment, but it will be understood that variations and modifications can be effected within the spirit and scope of the invention. For example, apparatus in accordance with the present invention may be advantageously used in satellite communications applications wherein a variable amplitude component of the signal must be limited while a narrow-band, bias or carrier component of the signal is preserved.

What is claimed is:

1. Apparatus for limiting the amplitude of a composite signal having a narrow-band component without impairing said narrow-band component comprising:
    means for receiving said composite signal;
    means for producing a remainder signal coupled to said means for receiving, said remainder signal comprising said composite signal with the narrow-band component substantially removed;
    means for providing a peak signal from said remainder signal, said peak signal comprising peaks in said remainder signal beyond a given amplitude range; and
    means having said peak signal and said composite signal as inputs for combining said peak signal with said composite signal to produce an amplitude limited composite signal whereby said peaks in said peak signal and corresponding peaks in said composite signal substantially cancel and said narrow-band component is substantially unimpaired.

2. The apparatus recited in claim 1, further comprising phase compensation means for providing said composite signal and said peak signal in proper phase relation to said means for combining so that said peaks in said peak signal and corresponding peaks in said composite signal substantially cancel and said narrow-band component is substantially unimpaired.

3. The apparatus recited in claim 2 wherein said means for combining comprises adding means and said phase compensation means comprises means for providing said composite signal and said peak signal to said adding means substantially 180°, out of phase.

4. The apparatus recited in claim 2 wherein said means for combining comprises subtracting means and said phase compensation means comprises means for providing said composite signal and said peak signal to said subtracting means substantially in phase.

5. The apparatus recited in claim 2 wherein said phase compensation means comprises a resistor-capacitor network having said composite signal as an input and having an output coupled to said means for combining.

6. The apparatus recited in claim 2 wherein:
said means for receiving comprise buffer amplifier means having said composite signal as an input;
said means for producing a remainder signal comprise filter means for attenuating the narrow-band component so that the narrow-band component is substantially eliminated;
said means for providing a peak signal comprise clipper means for selecting from said remainder signal a signal comprising peaks beyond a given amplitude range; and
said means for combining comprise operational amplifier means for combining said peak signal with said composite signal.

7. The apparatus recited in claim 6 wherein said filter means comprises a twin-T filter network and further comprises phase compensation means for altering the phase of said remainder signal.

8. The apparatus recited in claim 6 wherein said clipper means comprise operational amplifier means having a signal proportional to said remainder signal coupled thereto as an input, said operational amplifier means coupled to sources of equal and opposite threshold reference voltages so that when said signal proportional to said remainder signal exceeds either of said threshold reference voltages by a small amount said operational amplifier means produces an output signal proportional to the excess of said signal proportional to said remainder signal over said threshold reference voltage.

9. The apparatus recited in claim 6, further comprising means for generating an adjustable threshold voltage coupled to said clipper means, said means for generating responsive to the presence of said narrow-band component and to the presence of multiple frequency components in said composite signal so that said clipper means automatically selects peaks in said remainder signal beyond a lower amplitude range when said narrow-band component or multiple frequency components are present in said composite signal.

10. The apparatus recited in claim 6 wherein said amplitude limited composite signal modulates the carrier frequency of FM broadcast transmitter means and said narrow band component comprises a stereo pilot tone.

11. Apparatus for limiting the amplitude of a composite signal having a narrow-band component without impairing said narrow-band component comprising:
first and second signal paths;
means for applying the composite signal to said signal paths;
means for producing a remainder signal in said first path, said remainder signal comprising said composite signal with the narrow-band component substantially removed;
means in said first path for providing a peak signal from said remainder signal, said peak signal comprising peaks in said remainder signal beyond a given amplitude range;
means for combining said peak signal and said composite signal; and
means for providing said composite signal and said peak signal in proper phase relation to said means for combining whereby said means for combining produces an amplitude limited composite signal wherein said peaks in said peak signal and corresponding peaks in said composite signal substantially cancel and said narrow-band component is substantially unimpaired.

12. The method of amplitude limiting a composite signal having a narrow-band component without impairing said narrow-band component comprising the steps of:
producing a remainder signal from the composite signal, said remainder signal comprising the composite signal with the narrow-band component substantially removed;
providing a peak signal from said remainder signal, said peak signal comprising peaks in said remainder signal beyond a given amplitude range; and
combining said peak signal and said composite signal to produce an amplitude limited signal whereby said peaks in said peak signal and corresponding peaks in said composite signal substantially cancel and said narrow-band component is substantially unimpaired.

13. The method recited in claim 12, further comprising the step of providing said composite signal and said peak signal in proper phase relation before combining said composite signal and said peak signal so that said peaks in said peak signal and corresponding peaks in said composite signal substantially cancel and said narrow-band component is substantially unimpaired.

* * * * *